(12) United States Patent
Prior et al.

(10) Patent No.: US 10,511,277 B2
(45) Date of Patent: Dec. 17, 2019

(54) AUDIO SIGNAL PROCESSING

(71) Applicant: Cirrus Logic International Semiconductor Ltd., Edinburgh (GB)

(72) Inventors: Morgan Timothy Prior, Dunbar (GB); Robert Rand, Peebles Borders (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/094,193

(22) PCT Filed: Jun. 30, 2016

(86) PCT No.: PCT/GB2016/051990
§ 371 (c)(1),
(2) Date: Oct. 16, 2018

(87) PCT Pub. No.: WO2017/187113
PCT Pub. Date: Nov. 2, 2017

(65) Prior Publication Data
US 2019/0131946 A1    May 2, 2019

Related U.S. Application Data

(60) Provisional application No. 62/329,293, filed on Apr. 29, 2016.

(51) Int. Cl.
*H03G 3/30* (2006.01)
*G10L 25/51* (2013.01)
*H04R 3/00* (2006.01)

(52) U.S. Cl.
CPC ........... *H03G 3/3005* (2013.01); *G10L 25/51* (2013.01); *H04R 3/00* (2013.01); *H04R 2420/01* (2013.01); *H04R 2430/01* (2013.01)

(58) Field of Classification Search
CPC .... H03G 3/3005; H04R 3/00; H04R 2430/01; H04R 2420/01; G10L 25/51
(Continued)

(56) References Cited

U.S. PATENT DOCUMENTS

| 3,831,095 A | 8/1974 | Mounce |
| 4,641,361 A | 2/1987 | Rosback |

(Continued)

FOREIGN PATENT DOCUMENTS

| JP | H11355691 A | 12/1999 |
| JP | 2006295698 A | 10/2006 |

(Continued)

OTHER PUBLICATIONS

International Search Report and Written Opinion of the International Searching Authority, International Application No. PCT/GB2016/051990, dated Mar. 14, 2017.

(Continued)

*Primary Examiner* — Paul Kim
(74) *Attorney, Agent, or Firm* — Jackson Walker L.L.P.

(57) ABSTRACT

This application relates to methods and apparatus for audio signal processing, for example by a codec. An audio signal processing module (301) has at least one input (303, 304) for receiving first and second input signals (Din1, Din2) and an output path for outputting an output audio signal (Vout). The first and second input signals may be supplied by a first audio component (100) and may correspond to the same source audio data. A controller (305) is configured to compare the first and second input signals and to select one of the first or second input signals as the basis for a signal to be supplied to said output path based on the comparison. The controller may determine a measure of similarity (Sim) in content between the first and second input signals.

16 Claims, 4 Drawing Sheets

(58) Field of Classification Search
USPC .......................................................... 381/104
See application file for complete search history.

(56) References Cited

U.S. PATENT DOCUMENTS

| | | |
|---|---|---|
| 2007/0070256 A1 | 3/2007 | Ogusu |
| 2008/0094524 A1* | 4/2008 | Schobben ................ H04R 5/04 348/738 |
| 2014/0170979 A1 | 6/2014 | Samanta |
| 2015/0326195 A1 | 11/2015 | Trammell |

FOREIGN PATENT DOCUMENTS

| | | |
|---|---|---|
| JP | 2011244197 A | 12/2011 |
| JP | 2011244197 A1 | 12/2011 |
| JP | 2015162836 A | 9/2015 |
| KR | 20080101321 A | 11/2008 |
| KR | 20090016265 A | 2/2009 |
| WO | 2006018747 A1 | 2/2006 |
| WO | 2011115766 A1 | 9/2011 |
| WO | 2014025542 A1 | 2/2014 |
| WO | 2014150598 A1 | 9/2014 |
| WO | 2015150066 A1 | 10/2015 |
| WO | 2016138236 A1 | 9/2016 |

OTHER PUBLICATIONS

Combined Search and Examination Report under Sections 17 and 18(3), UKIPO, Application No. GB1810499.2, dated Aug. 14, 2018.
Search Report under Section 17(6) (related to claim 53), UKIPO, Application No. GB1611492.8, dated Apr. 4, 2018.
Search Report under Section 17(6) (related to claim 67), UKIPO, Application No. GB1611492.8, dated Apr. 4, 2018.
Combined Search and Examination Report under Sections 17 and 18(3), UKIPO, Application No. GB1611492.8, dated Dec. 21, 2016.
Combined Search and Examination Report under Sections 17 and 18(3), UKIPO, Application No. 1810505.6, dated Dec. 18, 2018.

* cited by examiner $Vout1 = A.DSDin + A.Vn$ $Vout2 = A.DSDin + Vn$

AUDIO SIGNAL PROCESSING

FIELD

The field of representative embodiments of this disclosure relates to methods, apparatuses, and/or implementations concerning or relating to audio signal reproduction or rendering. Methods, apparatuses, and/or implementations include, but are not limited to, those concerning the appropriate selection, from a plurality of received signals, of which signal to use for reproduction and/or definition of appropriate conditioning of the selected signal, based at least in part on properties of the signals.

BACKGROUND

To provide the best quality audio, a general principle is to apply as few operations as possible to signals in the signal path from an audio signal source to the audio signal destination, i.e. the eventual audible signal, whether these signals and operations are digital and/or analog. Each stage of processing may introduce audio artifacts such as added truncation or thermal noise to the signal, or added non-linear signal-related components, i.e. distortion, to the signal, or may give a frequency response that is not flat or does not correspond exactly to some desired optimal frequency response. Also for time-sampled signals, the sample rate should generally be as high as is practicable.

In many instances an audio reproduction apparatus may have at least one mode of operation in which audio data received, e.g. the 'raw' audio data from a storage medium, may be subject to minimal processing, for example a single-bit pulse-density-modulated (PDM) bit stream may be received and passed through a simple one-bit-input digital-to-analog convertor (DAC) and through a buffer amplifier to drive an audio output transducer such as a loudspeaker. The amplifier may have controlled gain to provide a volume control, i.e. the gain is set by a received volume control signal.

However in other cases, it may be desired to perform some operation on the input signal, for example mixing in other signals, or applying some deliberate frequency response weighting or applying a user-controlled or automatic gain control in the digital domain. For instance, an electronic device such as a smart phone may allow playback of stored audio data, such as music. If some event occurs during music playback that would be indicated by an audible alert, e.g. a tone to indicate receipt of a message or a status alert such as low battery, such a tone may be mixed into the music signal being output.

FIG. 1 shows an example where one component 100 of an audio system, which may be circuit, e.g. a single integrated circuit or a plurality of integrated circuits, or a functional unit or module, may in a first mode of operation provide via a first signal path an audio bit stream DSDin, say a one-bit oversampled audio bit stream, to a second component 101 comprising a buffer amplifier 102 with a controllable gain A2. In an alternate mode of operation, implemented via a second signal path, the audio bit stream DSDin may be first decimated to provide a multi-bit PCM word at a lower sample rate, which is then subject to a digital gain Apcm and possibly mixed with or substituted by some other signal, for example a ring tone for a wireless telephone. The resulting signal PCMout is then transmitted to the second component 101, and passed through the buffer amplifier 102, which in this mode may be set at a fixed gain. Buffer amplifier 102 may be a digital-input buffer amplifier, for example a digital PWM modulator, or may incorporate a digital-to-analog converter and an analog buffer amplifier. The signal PCMout may be re-converted into a one-bit (or multi-bit) oversampled audio bit stream before being input to the second component 101.

The first component 100 may for example be an applications processor (AP) in a wireless telephone handset. The second component 101 may be a codec integrated circuit inside the handset, or perhaps at the remote end of an attached accessory such as a headset, in either case perhaps switchably connected to the applications processor via a switched connection at a socket or plug or similar.

There can, in practice, be several problems with this arrangement.

A volume control signal controlling any gain to be applied by the buffer amplifier 102 in the first mode of operation will generally be generated in the applications processor. However the transmission link from the applications processor to the codec may not readily allow transmission of this control information. In some instances the volume control signal may be generated at a high level of the operating system of the application processor, for example within some Android™ subsystem, and there may be unacceptably large delays, perhaps of the order of 300 ms, in transferring the volume control signal to the second component. These delays may be problematic, especially say if the control signals comprise a long ramped sequence of ramped gain by single-step increments.

Similarly the second component 101 also requires some signal to control whether to accept DSDin or PCMout as its input signal for processing, and which of the respective appropriate gains to apply.

Another issue is illustrated with respect to FIGS. 2a and 2b. Assuming an appropriate sample rate and noise shaping of the received oversampled audio bit stream DSDin, the noise level apparent in the audible output may be dominated by the thermal noise of the driver amplifier, i.e. buffer amplifier 102.

In FIG. 2a, which illustrates a model of noise in the first mode of operation using the first signal path, this noise source is represented by noise signal Vn added to DSDin (DSDin being regarded as an equivalent analog signal) at the input to the gain-controlled amplifier 102, which amplifier may then be assumed noiseless. Regardless of the volume setting, a (near) full-scale audio signal at Vin will still appear (near) full-scale when added to Vn. The peak-signal-to-noise ratio at the input to the noiseless amplifier is thus the full-scale signal divided by the noise Vn. The combined signal is then regarded as passing through the noiseless amplifier stage, which will scale signal and noise together and thus not affect the overall signal-to-noise.

In FIG. 2b, which illustrates a model of noise in the second mode of operation using the second signal path, the received DSDin signal is down-sampled and passed through a digital multiplier, before transmission to the second component and being added (regarded as an equivalent analog signal) to the equivalent noise source Vn. In contrast to the potentially full-scale signal added to the noise in FIG. 2a, the maximum level of the signal PCMout will be some fraction A of the full-scale of the PCM digital signal PCMout. Thus the signal-to-noise ratio will be a factor 1/A worse in this second mode of operation than the case for the first mode of operation as illustrated in FIG. 2a. The driver amplifier 102 may be required to drive say 1 Vrms into a line load with the amplifier at "unity" gain, whereas a typical peak signal into a headphone speaker may be 100 mV rms or more likely 10 mVrms, so the gain A may typically be 1/10 or even 1/100 so this degradation in signal-to-noise may be objectionable.

EXAMPLE EMBODIMENTS OF THE PRESENT DISCLOSURE

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

According to the present invention there is provided an audio signal processing module comprising:
 at least one input node for receiving first and second input signals;
 an output path for outputting an output audio signal; and
 a controller configured to compare the first and second input signals and to select one of the first or second input signals as the basis for a signal to be supplied to said output path based on the comparison.

The controller may be configured to compare the first and second input signals by determining a measure of similarity in content between the first and second input signals.

The controller may be configured to select the first input signal if the first and second input signals are determined to be similar to one another and to select the second input signal if the first and second input signals are determined to be dissimilar to one another. The first input signal may correspond to a higher quality signal, for audio content of both of the input signals, than the second input signal. In some examples the controller may be configured to identify one of two received input signals as the first input signal and the other as the second input signal based on at least one of sample rate and digital resolution. In other examples the first input signal may correspond to an input signal received at a first input node with the second input signal corresponding to an input signal received at a second input node.

In some instances the first input signal may a one-bit signal. The first input signal may have a higher sample rate than the second input signal. The second input signal may be a multi-bit signal.

In some implementations the controller may comprise at least one filter for filtering at least one of the input signals before comparison. The at least one filter may comprise a low-pass filter.

The controller may comprise at least one band-splitter to split the input signals into components in different frequency bands for comparison and/or at least one frequency transform module configured to provide spectral analysis of spectral components of the input signals in respective frequency bins for comparison.

In some implementations the controller may be configured to compare the first and second input signals by comparing the amplitudes of the first and second input signals.

The controller may be configured to compare the amplitudes of the first and second input signals by comparing at least one: an instantaneous signal level, an average signal level over a time window or a peak signal level in a time window. The controller may be configured to compare the amplitudes of the first and second input signals in each of a plurality of frequency bands.

Additionally or alternatively the controller may be configured to compare the first and second input signals by correlating the first and second input signals. The controller may be configured to correlate the first and second input signals by applying at least one of a time-domain cross correlation or autocorrelation.

The controller may be configured to process the first and second input signals to compensate for any fixed time offset in the first and second input signals before comparison.

In some implementations the controller may be configured so as to vary selection of the first or second input signal based on the comparison of the first and second input signals only if both the first and second input signals are above some respective threshold level.

In some implementations the controller may be configured to compare the first and second signals by monitoring for the presence in one of the input signals of a predetermined audio feature.

The audio signal processing module may comprise at least one variable gain stage for applying a controlled gain to the selected one of the first or second input signals. The controller may be configured to control the at least one variable gain stage based on the comparison of the first and second input signals.

In some implementation the controller may be configured to determine an estimate of any scaling mismatch between the first and second input signals, at least during any period when the comparison of the first and second input signals indicates that the first and second input signals are similar to one another. The controller may be configured to condition the estimate of any scaling mismatch by applying at least one of: an attack time constant, a delay time constant; a hold-time; a defined ramp rate or range of allowable ramp rates; and hysteresis. The controller may be configured to control a gain applied by the at least one variable gain stage to the first input signal based on the estimate of scaling mismatch. The controller may be configured to control a gain applied by the at least one variable gain stage to the second input signal based on a predetermined gain setting.

In some implementations the at least one variable gain stage may comprise a gain element in the output path, such as a variable gain amplifier. The controller may be configured to control the gain element in the output path based on:
 the estimate of scaling mismatch when the comparison of the first and second input signals indicates that the first and second input signals are similar to one another; and
 a predetermined gain setting when the comparison of the first and second input signals indicates that the first and second input signals are dissimilar to one another.

In some implementations the at least one variable gain stage may comprise a first gain element in a first signal path for the first input signal and a second gain element in a second signal path for the second input signal and the controller is configured to select a signal from downstream of the first gain element or the second gain element to be supplied to the output path. The first gain element may be a variable gain element and the second gain element may be a fixed gain element. In some implementations the first and second gain elements may comprise respective digital to analogue converters.

The audio signal processing module may comprise a selector a selector for selecting one of the first and second input signals wherein the controller controls the selector based on the comparison of the first and second input signals. The selector may comprise a multiplexor. In some implementations the selector may comprise a first selector element in a first signal path for the first input signal and a second selector element in a second signal path for the second input signal, the first and second selector elements being selectively operable by the controller to enable or disable an output based on the respective input signal. The first and second selector elements may comprise respective digital to analogue converters. The selector and the controller may be configured to apply a cross fade when changing which of the input signals is supplied to the output path.

The first input signal may, in some instances, be a digital-stream-direct data signal. The first input signal may be received using a DSD-over-PCM data transfer protocol.

The audio signal processing module may be incorporated in a codec and/or may be implemented as an integrated circuit.

Aspects also relate to an audio device including an audio signal processing module in any of the variants described above.

Such an audio device may comprise a first audio component which is configurable to supply said first and second input signals to the audio signal processing module simultaneously. The first audio component may be configurable to receive a source audio data stream and direct the source audio data stream to first and second signal paths to generate said first and second input signals for the an audio signal processing module respectively from the source audio data stream. The audio content of the first input signal may be wholly based on the source audio data stream. The second signal path of the first audio component may comprise a variable gain element controlled based on a gain control signal internal to the first audio component and/or a module for adding to or replacing part of the audio content source audio data stream with additional or replacement audio content. In some implementations the second signal path of first audio component may comprise a decimator for reducing the sample rate of the second input signal compared to the source audio data stream.

The audio device may comprise at least one loudspeaker operable to be driven, in use, by said output audio signal. The audio device may comprise at least one connector for a peripheral audio device to be removably connected wherein the device is operable, in use, to supply said output audio signal to the connector.

The audio device may be at least one of: a portable device; a battery powered device; a communications device; a mobile telephone; a media player; a computing device; a laptop, tablet or notebook computer; a wearable device.

Aspects also relate to an audio signal processing module comprising:
  at least one input node for receiving first and second input signals;
  at least one variable gain stage; and
  an output path for outputting a signal based on a selected one of the first and second input signals; and
  a controller operable to compare the first and second input signals and control the at least one variable gain stage based on the comparison.

The controller may be configured to compare said first and second input signals to determine an estimate of any scaling mismatch between the first and second input signals. The controller may be configured to condition the estimate of any scaling mismatch by applying at least one of: an attack time constant, a delay time constant; a hold-time; a defined ramp rate or range of allowable ramp rates; and hysteresis. The controller may be operable to control the at least one variable gain stage to apply a gain to the first input signal based on the estimate of scaling mismatch. The controller may also be operable to control the at least one variable gain stage to apply a gain to the second input signal based on a predetermined gain setting.

The at least one variable gain stage may comprise a variable gain element in the output path wherein the controller is operable in a first mode to control the gain of the variable gain element in the output path based on the estimate of scaling mismatch. The controller may be operable in the first mode when the comparison of the first and second input signals indicates that the first and second input signals are similar to one another. The controller may be operable, in a second mode, to control the gain of the variable gain element in the output path based on a predetermined gain setting. The controller may be operable in the second mode when the comparison of the first and second input signals indicates that the first and second input signals are dissimilar to one another.

In some implementations the at least one variable gain stage may comprise a first gain element in a first signal path for the first input signal and a second gain element in a second signal path for the second input signal and the controller may be configured to control the gain of at least the first gain element. The first gain element may be a variable gain element and the second gain element may be a fixed gain element. The first and second gain elements may comprise respective digital to analogue converters.

The audio signal processing module may also comprise a selector a selector for selecting one of the first and second input signals wherein the controller controls the selector based on the comparison of the first and second input signals.

In a further aspect there is provided an audio signal processing module comprising:
  at least one input node for receiving first and second input signals;
  at least one variable gain stage for applying a variable gain to at least one of the first and second input signals;
  a selector for selecting a signal based on one of the first and second input signals to be output; and
  a controller operable to compare the first and second input signals and control at least one of the selector and the variable gain stage based on the comparison.

Also provided is an audio apparatus comprising:
  an input for receiving a source audio data stream; and
  first and second signal paths for generating first and second audio signals from said source audio data stream and outputting said first and second audio signals; wherein the second signal path comprises at least one module for varying at least one of: the sample rate; bit resolution; gain; and audio content of the second audio signal; and
  wherein the audio apparatus is configured to output said first and second audio signals simultaneously.

In a further aspect there is provided a method of audio signal processing comprising:
receiving first and second input signals;
comparing the content of said first and second input signals; and
outputting an output signal based on one of said input signals;
wherein the method comprises at least one:
selecting one of the first or second input signals as the basis for the output signal based on said comparison; and
controlling a gain applied to the output signal based on said comparison.

A further aspect relates to an audio signal processing module comprising:
a first input node, for receiving a first digital audio signal;
a second input node, for receiving a second digital audio signal;

an output node, for outputting an output audio signal;

a controller, for receiving said first and second audio signals and deriving therefrom an indication of the similarity of the two signals and/or an indication of the relative amplitude of the two signals; and a selector for selecting based on the indication of the similarity whether the output analog audio signal is to be based on the first digital audio signal or is to be based on the second digital audio signal; and/or a gain stage in the signal path from the first input node to the output node for applying a gain based on the indication of the relative amplitude.

The apparatus may be configured to accept and process said first audio signal at a higher sample rate than said second audio signal. The apparatus may be configured to accept and process said first audio signal at a higher resolution than said second audio signal. The output signal may be an analog output audio signal.

In a further aspect there is provided a controller, for receiving at least first and second digital audio signals and determining from at least one common characteristic of said audio signals an indication of the similarity of said audio signals.

Also provided is an audio signal processing module comprising a controller for selecting one of a plurality of received audio data streams at least in part based on properties of said received audio data streams.

In a further aspect there is an audio signal processing module comprising a controller for selecting one of a plurality of received audio data streams and for controlling the conditioning of selected data stream at least in part based on properties of said received audio data streams.

Embodiments also relate to an audio signal processing module comprising a controller for selecting one of a plurality of received audio data streams and for controlling the conditioning of selected data stream at least in part based on audio properties of signals carried by said received audio data streams.

BRIEF DESCRIPTION OF THE DRAWINGS

The invention will now be described by way of example only with reference to the accompanying drawings, of which.

DETAILED DESCRIPTION

Figure 3:
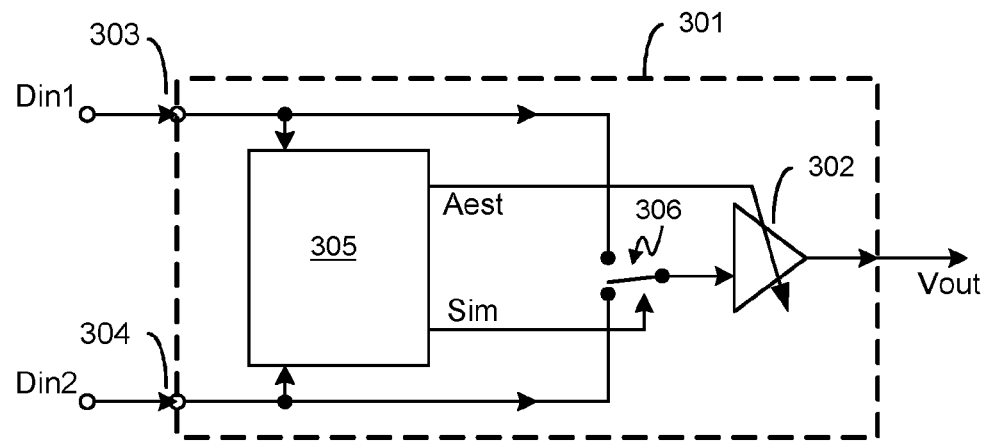
FIG. 3 illustrates an audio component according to an embodiment.

FIG. 3 illustrates an embodiment 301 of an audio signal processing module 101, for example a codec, which may be used as the second component described above and which at least mitigates at least some of the above issues. While in the following discussion the audio signal processing module 101 will be described with reference to a codec, it will be understood that in general the audio signal processing module (which may be used as the second component described with reference to FIG. 1) may be some other component or module, for example a digital amplifier module containing digital-to-analog conversion (DAC) functions but no analog-to-digital conversion (ADC) functions in the forward signal path.

Codec 301 receives two digital audio signal streams Din1 and Din2 at respective inputs 303 and 304. In some instances Din1 and Din2 may have been derived from the same audio source data, e.g. a stored audio track. In such a case one of the input signals may be regarded as a 'better' representation of the audio source data, for instance being a substantially full scale version of the original audio source data without any significant alterations, whereas the other input signal may have been processed, for example filtered and decimated down to a lower sampling frequency and/or to apply a digital gain control. Din1 for example, may correspond to a largely unprocessed or "pure" version of the audio source data, for instance a one-bit oversampled audio stream, while the input signal Din2 may correspond to a processed representation of the same source material, for example after a digital volume control, which may be considered as a less 'pure' or less preferred version of the source data. Therefore in this particular embodiment, Din1 represents a signal from a source S that has not been processed in any non-trivial manner while Din2 represents a signal from the same source that has been processed in some non-trivial manner.

Codec 301 comprises an output amplifier 302 which generates an analog audio output signal Vout, for instance for driving a loudspeaker.

Codec 301 comprises a controller 305, for receiving said first and second audio signals Din1 and Din2. The controller 305 may, in some embodiments, be configured to select which of the received first and second input signals Din1 and Din2 should be passed to the output amplifier 302.

In the example discussed above the input signal Din1 may be seen as the preferred signal to be passed to the output amplifier 302 if both signals are derived from the same source data without any alterations to the underlying audio content. For example if both input signals Din1 and Din2 correspond to the same music track with no change to the audio content it may be preferred to pass Din1 to the output amplifier and control the gain of the amplifier as described above to provide the best noise performance.

However if the audio content of Din2 varies, at some point, from the audio content of Din1, e.g. by part of the base audio data being replaced or mixed with some other audio content such as an alert tone, then clearly signal Din2 is preferred as it contains the additional audio content of interest. In embodiments of the present invention the controller 305 may select the relevant input signal to be used, Din1 or Din2, based on properties of the input signals themselves, i.e. without requiring an separate externally supplied control signal. In some embodiments the controller may also determine an appropriate gain setting to be applied for the output amplifier based on the properties of the input signals themselves.

The controller may derive from the input signals Din1 and Din2 an indication, illustrated as signal "Sim", of the similarity or degree of similarity between the two signals Din1 and Din2 (or equivalently the extent of any differences between these input signals). The controller effectively therefore compares the two input signals Din1 and Din2 to one another as will be described in more detail below.

In some embodiments the controller 305 may comprise one or more filters for filtering at least one of the input signals before, or as part of, the comparison. For example a low pass filter (LPF) may be applied to either one or possibly both of the input signals to remove undesired signal components, such as quantization noise for example, as may be expected at high frequencies in say an oversampled delta sigma modulated signal. Additionally or alternatively the controller 305 may comprise one or more filters or bandsplitters to decompose the input signals into components in different frequency bands for comparison in like-for-like frequency bands. The controller may alternatively or additionally comprise frequency transform modules for providing spectral analysis for comparison of some or all of the spectral components in respective frequency bins. The frequency bands or bins may be linearly spaced in frequency or logarithmically spaced, for example in octaves or part-octaves, or may be spaced in some other, non-uniform, fashion.

The comparison of the input signals Din1 and Din2 may comprise comparing the amplitude of the two input signals. The amplitude of the full-band or part-band signal components may be compared in terms of at least one of instantaneous signal levels or average full- or half-wave rectified instantaneous signal levels or peak-detected signal levels. The amplitudes may be compared by subtraction, or by ratio, for example by first mapping logarithmically and then subtracting the mapped log values. If the two signals Din1 and Din2 correspond to the same audio content, i.e. the same basic waveform, with perhaps just some digital gain applied to signal Din2, then the ratio of the amplitude of two signals in any particular frequency band would expected to be substantially consistent and the amplitude of each signal would rise and fall at the same time as one another (perhaps after adjusting for any small delay between the two signals). Any tones introduced into one of the signals, say Din2, would result in a likely mismatch in amplitude in at least some frequency bands as the other signal would lack such tones.

The comparison may additionally or alternatively be performed at least in part by estimation of a time-domain cross-correlation or auto-correlation. The controller may be configured to determine and correct for any fixed delay difference between the upstream signal paths from the original common source by correlating the input signals, for example from multiple cross-correlation measurements or by searching for peaks or other distinctive signatures of the incoming signals and measuring the difference in time arrival of these particular features. When the signals are similar and correspond to the same underlying content, there will be a significant correlation but the addition or substitution of tones into one of the signals will result in a lack of correlation.

In some embodiments the controller may derive the similarity signal Sim at any time when the two input signals Din1 and Din2 are being received. In some embodiments however the comparison may be interrupted during periods in which both input signals are lower than some predetermined minimum level, i.e. amplitude level, to avoid false comparisons on low-level noise. In other words as long as both input signals are above some threshold, which is high enough to allow a fair comparison to be made, the controller 305 will compare the signals and update the signal Sim indicative of the degree of similarity accordingly. If the signals drop below the threshold however the then current value of similarity signal may be maintained, by stopping further comparison until the signal levels increase and/or pausing updating of the similarity signal Sim.

The controller 305 may thus be sensitive to detect the presence at the two inputs 303, 304 of similar signal waveforms or spectral distributions which are scaled substantially uniformly across the full audio band, indicating that the signals are derived from a common signal source but with different gains applied upstream.

The controller 305 may thus be sensitive to detect the presence of a tone or tones appearing in a frequency band in only one of the said first and second audio signals.

The controller may therefore be able to determine when the input signals correspond to the same underlying audio content and also when some additional or alternative audio content is present in one of the signals.

Alternatively or additionally in some embodiments, if the nature of a signal component which may be mixed with or substituted for the original signal content is known in advance, the controller may comprise a module configured specifically to detect a signal component of this sort in at least one of the input signals. In other words if a particular form of audio feature may be expected to be used at times, e.g. as an audio alert, and thus a signal corresponding to such an audio feature may occasionally be mixed with or replace any base audio content in one of the input signals Din1 or Din2, then the controller may be configured to detect any instances of such an audio feature. For example if it may be anticipated that, as a form of audible notification, any music signal may be temporarily replaced by silence for a short known range of time duration, followed, for another known range of durations, by a user feedback signal tone or ring tone of a particular known set of frequencies and range of amplitudes, then followed by silence for a short known range of time duration, the controller may comprise a silence detector and one or more tone detectors configured for the anticipated tones. Detection of one of the predetermined or anticipated audio features in one of the input signals thus may be used as an indication that that input signal is to be used as the preferred signal for passing to the output amplifier, at least for the duration of the noise feature.

The controller 305 may thus derive an indication Sim of the similarity or dissimilarity or the degree thereof of the two signals present at the two inputs 303, 304. If the two signals are indicated as being derived from the same source, but with a scaling factor difference, then the controller may also generate an indication, illustrated as signal Aest, of the relative amplitude of the two signals. This signal Aest, may be seen as an estimated, derived or calculated indication of signal scaling between the two input signals, or equivalently of the gain apparently already applied to one input signal and thus the gain required to be applied to the other signal. In this way the gain applied upstream may be derived merely from the two input signals without any need to define and execute some communication path between the circuitry or software operating in the first component and circuitry or software running in the second component.

The signal Aest may be determined from the average apparent signal ratio across one, some or all of the frequency bands or frequency bins. In some embodiments the signal Aest may also be conditioned in some way, for example averaged over time, and any of attack and/or decay time constants or time hold-offs or ramp rates or hysteresis may be applied to changes in the value of the Aest signal to avoid over-frequent or over-rapid gain steps being requested to avoid possible audio output signal artifacts.

Codec 301 may also comprise a selector 306 of the form of a switch or multiplexer or the like for selecting whether the output analog audio signal is to be based on the first digital audio signal or is to be based on the second digital audio signal, i.e. whether the first audio signal or second audio signal is to be coupled to the output node. In some embodiments the selector 306 may be controlled by the controller 305 based on the degree of similarity between the input signals.

In some embodiments the gain of the output amplifier 302 may be controlled by the signal Aest if the first input signal, corresponding to a full scale signal DSDin, is selected. The gain of the output amplifier may be controlled to some predetermined value if the second input signal PCMout is selected. In some embodiments therefore the controller is operable to select between the input signals, Din1 and Din2, and set the gain of the amplifier based on the control signal Aest when a full scale input signal is selected for output. The gain may be set to a predetermined fixed level when the other signal is selected. In some embodiments however the codec may additionally or alternative be operable so that the selector is controlled by some external control signal, say received from an applications processor, but the gain of the amplifier is controlled based on the determined Aest signal when a particular input signal is selected. This in some embodiments the codec may be instructed by an external control signal as to which input signal to pass to the output, but it may use the internally derived gain control signal—thus avoiding the need to receive an external gain control signal.

As described above the controller 305 can thus determine when the input signals Din1 and Din2 correspond to the same underlying audio content as one another and also when some additional or alternative audio content is present in one of the signals. In the event that the two input signals correspond to the same audio content the 'better' signal input, e.g. the full scale signal Din1, may be selected for output to the amplifier. The amount of any upstream gain can be determined from the amplitude ratio of the two signals and the gain of the output amplifier 302 controlled accordingly. In this way the full scale signal is input to the amplifier, providing the best noise performance, but the gain of the output signal is controlled automatically without the need of a separate external gain control signal. In the event that additional or alternative audio content is detected, either by detecting a significant difference in similarity or by detecting a characteristic predetermined audio feature, the alternative input signal Din2 may instead by selected and output to the amplifier 302.

In some embodiments there may be some time-out between decisions in one or other direction to avoid over-frequent switching between signal paths. For example if the first input signal Din1 corresponds to a largely unprocessed or pure version of the audio source data whereas the second input signal represents the processed data, then it may be the second input signal that includes any additional or substitute audio content such as an audio alert. In such a case it may be desired to swap to using the second input signal as soon as a lack of similarity in the two input signals is detected, or a detector module detects a characteristic audio feature in the second input signal. Having swapped to the second input signal there may be a minimum time before swapping back to the first signal. Such time-outs may be implemented by attack or decay constants and/or hold times in producing the similarity signal Sim and/or by the processing of the similarity signal, e.g. by comparing to a suitable threshold or thresholds.

Figure 1:
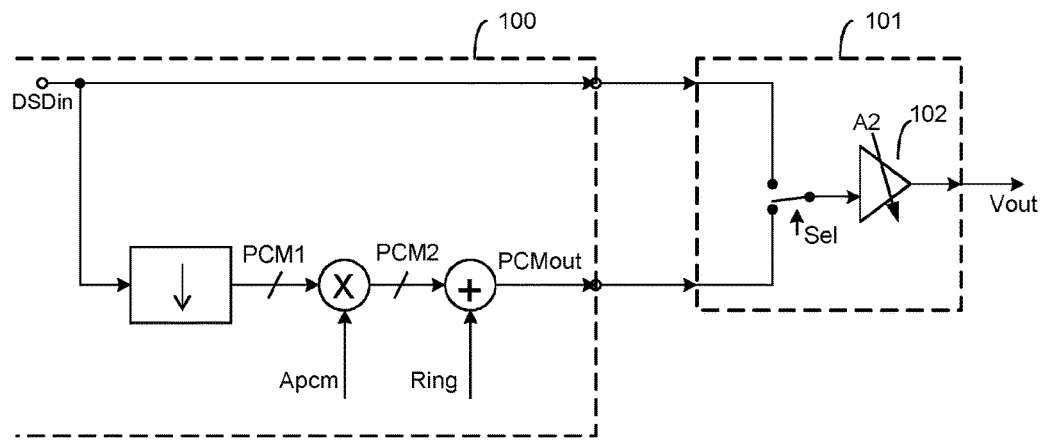
FIG. 1 illustrates an example audio reproduction apparatus operable in two modes.
Figure 2A:
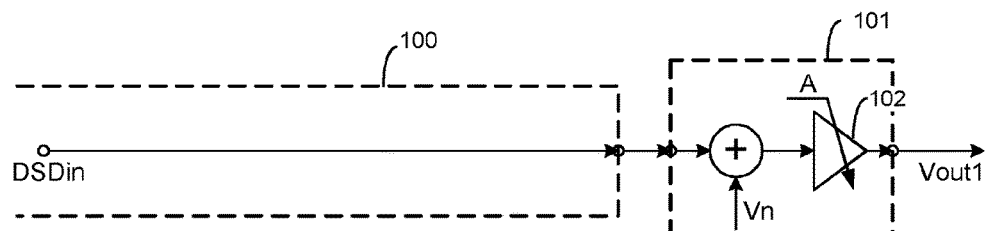
FIGS. 2a and 2b illustrates models of noise in the apparatus of the FIG. 1 operating in the first and second modes respectively.
Figure 2B:
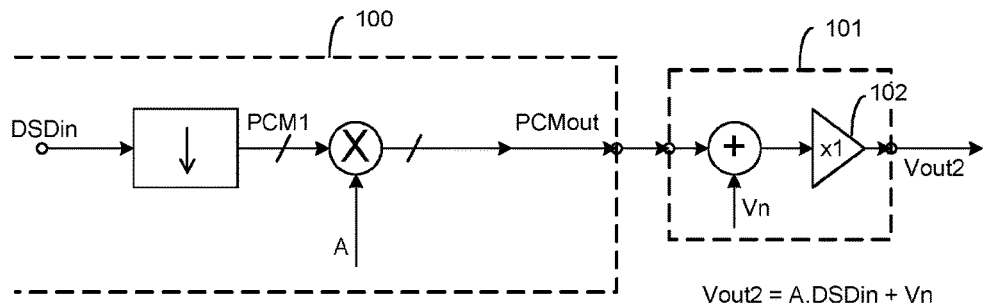

In some embodiments the first signal Din1 (which may correspond to the source data signal DSDin described with reference to FIG. 1) may be multi-bit or even a noise-shaped or un-noise-shaped PCM data stream. The preferred signal (for the base audio content) may be a higher sample rate than the non-preferred signal. Due to oversampling or noise shaping, the preferred signal may be of higher quality than the second signal even with a lower bit-width and may even be single bit.

However in some embodiments or system modes the nominal sample rate of the two signals Din1 and Din2 (which may correspond to DSDin and PCM respectively) may be the same or similar, and the decimator referred to above may be absent. The preferred signal may have a higher digital resolution than the non-preferred signal and thus be of higher quality.

Some embodiments may assume that the signal at one input, say 302, is always the preferred signal. Thus, the controller may be configured to default to using the signal received at that input whenever possible, with appropriate gain control of the amplifier 302, with the signal received at the other input being selected for use only when it contains some additional or alternative audio content. In other embodiments the codec may comprise modules to detect the sample rate and resolution of each input and configure the signal comparisons and decision-making accordingly. In other words the codec may decide which input signal corresponding to a higher quality signal and to default to using that signal whenever possible.

It will be appreciated that the two audio signals passing from the first to the second component are illustrated as two separate connections, i.e. two separate signal paths. In some embodiments there may be separate physical connections for each signal path but in some embodiments these two signals may be carried in some multiplexed fashion along the same physical wired or wireless connection, i.e. a common or single signal path carrying a combined physical signal. For example in different frames of a frame format such as Soundwire or a multi-channel 12S format. As will be described later a first audio component, such as an applications processor or the like, may thus be configured to provide the two different signals Din1 and Din2 simultaneously.

The output amplifier may receive a digital signal and may comprise a digital-to-analog converter (DAC). The overall conversion gain applied in a signal path from digital input signal to output signal may be controlled in whole or in part by both the conversion gain of the DAC, for example by adjusting a full-scale reference voltage or current, or by the analog signal gain of an analog amplifier stage, for example by electrical adjustment of the values of input or feedback resistors coupled to an operational amplifier.

In some embodiments the output signal Vout may be a digital signal, and the gain stage if present a digital gain stage such as a digital multiplier. Preferably the bit-width of digital signal Vout may be wider than the input to the gain stage or wide enough not to introduce significant truncation noise compared to other noise sources in the system or to the noise inherent in the preferred input signal received.

The output amplifier may receive an analog input signal derived from a DAC upstream. There may be a DAC that is shared by both the inputs to the codec, or there may be a separate DAC for each of the inputs to the codec. Alternatively there may be some components of a DAC which are shared between both signal paths. For instance the DAC could comprise a shared bank of analog components such as controllable current sources or switched capacitors or resistors or suchlike which are controlled by respective control logic depending on which input signal is to be converted.

The two inputs may be selected so that only one is coupled to the output at any one time, and any transition is directly from one mode to the other, or possibly via an intermediate state in which neither signal is coupled. Alternatively a transition between the inputs may be controlled to occur more gradually, in a cross-fade.

The embodiments above thus provide an output signal of high quality, avoiding the addition of artifacts such as noise where possible and with appropriate applied gain, yet accommodating the output of a more heavily processed or alternative signal where desired, with control occurring locally in the second component and thus occurring without the need to design the system to communicate commands from the first component to the second and suffering possible delays in such control or issues in compatibility of control generated in the first component for various alternative choices of second component.

In embodiments described above, the audio signal processing module comprises a controller for selecting one of two received audio data streams or for controlling the conditioning of a selected data stream at least in part based on audio properties of signals carried by said received audio data streams. In embodiments the controller in the second component may receive more than two input data streams and the controller may select one of this plurality of received audio data streams or control the conditioning of a selected data stream at least in part based on audio properties of signals carried by said received audio data streams. In embodiments, a controller may receive a plurality of digital audio signals and determine from at least one common characteristic of said audio signals an indication of the similarity of said audio signals.

In further embodiments the controller in the second component may receive more than two input data streams and the controller may select one of this plurality of received audio data streams or control the conditioning of a selected data stream at least in part based on non-audio properties of signals carried by said received audio data streams.

For example, one stream may be a DSD (Direct Stream Digital) data stream carried in a standard DoP (DSD over PCM) protocol in which successive 16 bit segments of DSD data are preceded by specific 8 bit headers to indicate that this is a DSD data stream rather than a PCM data stream. When carrying the correct headers, the gain to be applied to this data stream may still be detected by comparing the audio-related properties of the signal carried. An upstream controller might alter these headers to indicate that the DSD data stream being carried is to be ignored in favor of some other data stream, with or without stopping or pausing the actual transmission of the DSD audio data and the controller may thus be configured to detect the non-standard headers and select an appropriate alternate channel of data with a predetermined gain setting as described above. The headers included in the data stream may be inserted under the control of some high level component of the system such as Android™-based driver software.

Figure 4A:
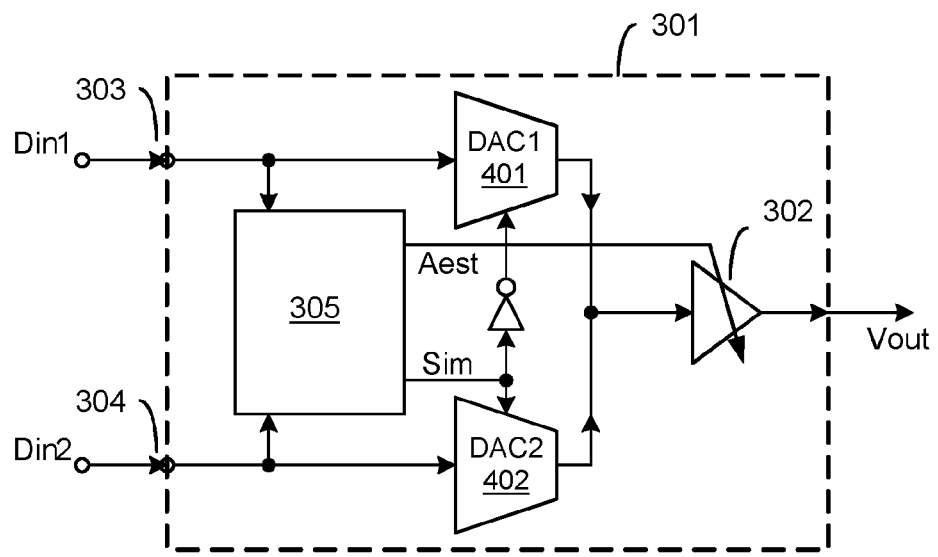
FIGS. 4a and 4b illustrate other examples of audio components.

FIG. 4a illustrates another example of an audio signal processing module 301 which receives first and second input signals Din1 and Din2 and outputs an output signal Vout based on one of these input signals. In the example illustrated in FIG. 4a the output amplifier 302 is an analogue amplifier and there are first and second DACs 401 and 402 for converting the first and second signals respectively into corresponding digital signals. In the example of FIG. 4a the DACs 401 and 402 also provide the functionality of the selector for selecting the appropriate input signal under control of the controller 305. The DACs 401 and 402 may be selectively enabled or disabled, i.e. put into a high impedance state, based on the control signal Sim. In the event the input signals are deemed to relate to similar content the first DAC 401 may be enabled and the second DAC disabled, with the gain of the variable gain element in the output path, i.e. output amplifier 302, being controlled by the derived estimate of scaling mismatch. If the signals are deemed to relate to dissimilar content the first DAC may be disabled and the second DAC enabled and gain of the output amplifier 302 controlled based on the predetermined gain setting.

Figure 4B:
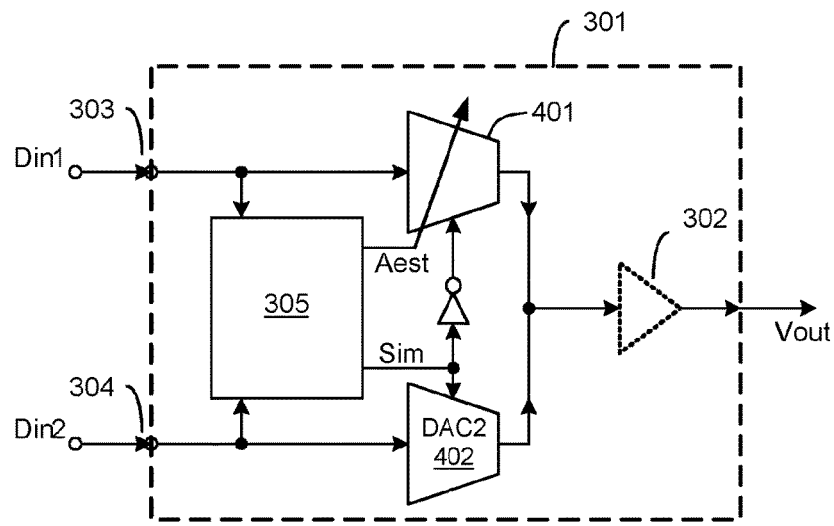

In some instances it may be possible to use the output of the DACs directly as the output signal, in which case the gain of the output signal may be controlled by control of the gain of the relevant DAC. For example is the output of the DAC is sufficient to be able to drive the required loudspeaker load, or if the output signal will only be used as a line out load, the output of the DAC may be used directly as the output signal. FIG. 4b illustrates an example similar to that shown in FIG. 4a but where the derived estimate of scaling mismatch Aest is used to control the gain of the first DAC 401 when enabled. The second DAC 402 may be operated to provide a fixed level of gain. The first and second DACs 401 and 402 can thus be seen as gain elements with at least the first DAC being a variable gain element.

In this example the output amplifier 302 may not be required. In some embodiments however a fixed gain amplifier may be included. The signal received by such a fixed gain amplifier will be gain adjusted and thus the SNR for the amplifier will vary with gain setting whether input signal Din1 or Din2 is selected as the basis for the output signal. However the first DAC 401 receives the full scale signal Din1 as described above and any noise associated with the DAC 401 will be scaled with the signal. This may still provide significantly better noise performance than using the second input signal Din2.

Figure 5:
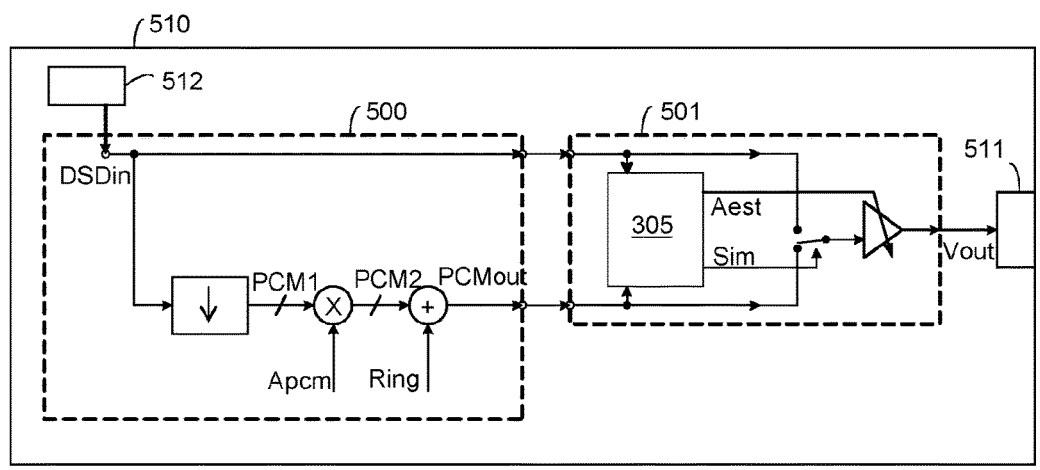
FIG. 5 illustrates a system including an audio component according to an embodiment.

FIG. 5 illustrates an embodiment comprising an audio reproduction device 510 comprising a first component 500 and a second component 501 as described above.

The device may also comprise an audio output transducer 511, for example a loudspeaker, and/or a connector for an external audio output transducer, for example a jack or plug for connection to an external loudspeaker or headphone. The device may also contain an input signal source 512, for example a memory for storing audio files or a wireless receiver for receiving external audio, which may be coupled via other circuitry inside or outside the first component to provide a common signal DSDin in the first component, based on which signal the first and second audio data streams may be supplied to the second component.

The first component 500 may be configured to receive data from the input source 512, e.g. as a DSD signal and to supply both first and second signals Din1 and Din2 simultaneously to the second component 501. The first signal Din1 may correspond largely to the data received from the input source 512 and thus may be a full scale DSD data stream. The first component may also produce the second signal Din2 from the input DSD data stream. This second signal may or may not be decimated and converted to a PCM signal. Any digital gain be applied based on a digital gain control signal Apcm within the first component. Any additional or substitute audio content, e.g. based on a supplied signal Ring, may also be introduced into the second signal.

In the event that there is no additional audio content, i.e. no audible alerts etc, the two signals may correspond to the same audio content, i.e. the source data from input source 512. In which case, as described previously the second component may select the first signal Din1 for use and derive the gain to be applied by the output amplifier without requiring a separate gain control signal. In the event that any additional or alternative audio content is added to the second signal Din2 the second component will detect that the received input signals are no longer similar and can swap to the second signal automatically.

Embodiments also relate to the first audio component on its own. Embodiments also relate to an apparatus comprising such a first audio component and the second audio component.

Audio reproduction device 510 may be, may be comprised in, or may comprise a device, which may be a portable and/or battery powered device such as a mobile telephone, an audio player, a video player, a PDA, a mobile computing platform such as a laptop computer or tablet and/or a games device.

In embodiments, and in reference to FIGS. 1 to 5, the following disclosed apparatuses and systems may be utilized and the following steps may be performed to constitute methods or implementations according to the present disclosure. Additionally, or alternatively, apparatuses, systems, and steps such as those listed below may be incorporated into corresponding apparatuses or systems according to other embodiments of this disclosure.

Figure 6:
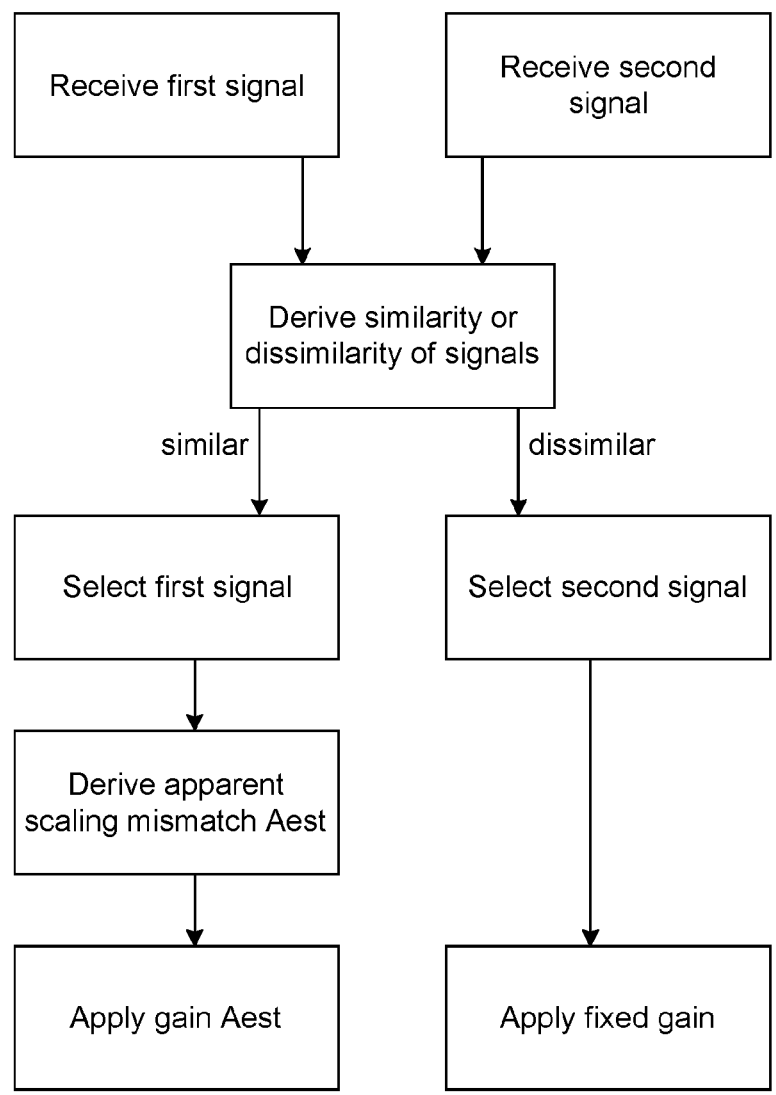
FIG. 6 illustrates one example of flowchart corresponding to a method according to an embodiment.

Embodiments may also comprise a method as illustrated in FIG. 6, or similar. The method illustrated by FIG. 5 corresponds to a method of processing the audio signals received by an audio component. As described above at least first and second input signals may be received. These input signals may be compared to determine the similarity or equivalently the dissimilarity between the signals. In the event that the signals are similar to one another then the first signal may be selected for use. The first signal may be a preferred signal for the similar audio content. The method may involve determining in any scaling difference or apparent mismatch between the two signals and deriving an estimate of such scaling mismatch. This estimate may then be used to control a downstream gain applied to first signal, e.g. by an output amplifier. If however the comparison of the input signals reveals that the signals are dissimilar to one another the second signal may be selected for use, with a fixed gain being applied downstream to the second signal.

The skilled person will thus recognise that some aspects of the above-described apparatus and methods, for example the calculations performed by the processor may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Embodiments of the invention may be arranged as part of an audio processing circuit, for instance an audio circuit which may be provided in a host device. A circuit according to an embodiment of the present invention may be implemented as an integrated circuit. One or more loudspeakers may be connected to the integrated circuit in use. Embodiments may be implemented in a host device, especially a portable and/or battery powered host device such as a mobile telephone, an audio player, a video player, a PDA, a mobile computing platform such as a laptop computer or tablet and/or a games device for example. Embodiments of the invention may also be implemented wholly or partially in accessories attachable to a host device, for example in detachable speakerphone accessories or digital amplifiers or the like. The host device may comprise memory for storage of code to implement methods embodying the invention. This code may be stored in a non-transitory fashion in the memory of the device during manufacture or test or be loaded into the memory at a later time.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

It should be understood—especially by those having ordinary skill in the art with the benefit of this disclosure—that that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element.

Further embodiments likewise, with the benefit of this disclosure, will be apparent to those having ordinary skill in the art, and such embodiments should be deemed as being encompassed herein.

The invention claimed is:

1. An audio signal processing module comprising:
at least one input node for receiving first and second input signals;
an output path for outputting an output audio signal; and
a controller configured to compare the first and second input signals and to select one of the first or second input signals as the basis for a signal to be supplied to said output path based on the comparison,
wherein the controller is configured to select the first input signal if the first and second input signals are determined to be similar to one another and to select the second input signal if the first and second input signals are determined to be dissimilar to one another, wherein the first input signal corresponds to a higher quality signal for audio content of both of the input signals than the second input signal, and wherein the controller is configured to identify one of two received input signals as the first input signal and the other as the second input signal based on at least one of sample rate and digital resolution.

2. An audio signal processing module as claimed in claim 1 wherein the first input signal is a one-bit signal and/or a digital-stream-direct data signal.

3. An audio signal processing module as claimed in claim 1 wherein the second input signal is a multi-bit signal.

4. An audio signal processing module as claimed in claim 1 wherein the controller comprises:

at least one filter for filtering at least one of the input signals before comparison; and/or
at least one frequency transform module configured to provide spectral analysis of spectral components of the input signals in respective frequency bins for comparison; and/or
at least one frequency transform module configured to provide spectral analysis of spectral components of the input signals in respective frequency bins for comparison.

5. An audio signal processing module as claimed in claim 1 wherein the controller is configured to compare the first and second input signals by:

comparing the amplitudes of the first and second input signals; or
correlating the first and second input signals; or
monitoring for the presence in one of the input signals of a predetermined audio feature.

6. An audio signal processing module as claimed in claim 5, wherein the controller is configured to compare the amplitudes of the first and second input signals in each of a plurality of frequency bands.

7. An audio signal processing module as claimed in claim 1 wherein the controller is configured to process the first and second input signals to compensate for any fixed time offset in the first and second input signals before comparison.

8. An audio signal processing module as claimed in claim 1 wherein the controller is configured so as to vary selection of the first or second input signal based on the comparison of the first and second input signals only if both the first and second input signals are above some respective threshold level.

9. An audio signal processing module as claimed in claim 1 comprising at least one variable gain stage for applying a controlled gain to the selected one of the first or second input signals wherein the controller is configured to control said at least one variable gain stage based on the comparison of the first and second input signals.

10. An audio signal processing module as claimed in claim 9 wherein the controller is configured, at least when the comparison of the first and second input signals indicates that the first and second input signals are similar to one another, to determine an estimate of any scaling mismatch between the first and second input signals.

11. An audio signal processing module as claimed in claim 10 wherein the controller is configured to control a gain applied by the at least one variable gain stage to the first input signal based on the estimate of scaling mismatch and to control a gain applied by the at least one variable gain stage to the second input signal based on a predetermined gain setting.

12. An audio signal processing module as claimed in claim 9 wherein the at least one variable gain stage comprises a gain element in the output path, and wherein the control is configured to control the gain element in the output path based on:

the estimate of scaling mismatch when the comparison of the first and second input signals indicates that the first and second input signals are similar to one another; and
a predetermined gain setting when the comparison of the first and second input signals indicates that the first and second input signals are dissimilar to one another.

13. An audio signal processing module as claimed in claim 1 comprising a selector for selecting one of the first and second input signals wherein the controller controls the selector based on the comparison of the first and second input signals.

14. An audio device comprising a first audio component and an audio signal processing module as claimed in claim 1 wherein the first audio component is configurable to supply said first and second input signals to the audio signal processing module simultaneously.

15. An audio device as claimed in claim 14 where the first audio component is configurable to receive a source audio data stream and direct the source audio data stream to first and second signal paths to generate said first and second input signals for the an audio signal processing module respectively from the source audio data stream wherein the audio content of said first input signal is wholly based on the source audio data stream and wherein the second signal path of the first audio component comprises at least one of: a variable gain element controlled based on a gain control signal internal to the first audio component; and a module for adding to or replacing part of the audio content source audio data stream with additional or replacement audio content.

16. An audio signal processing module comprising:

at least one input node for receiving first and second input signals;
at least one variable gain stage for applying a variable gain to at least one of the first and second input signals;
a selector for selecting a signal based on one of the first and second input signals to be output; and
a controller operable to compare the first and second input signals and control at least one of the selector and the variable gain stage based on the comparison,
wherein the controller is configured to select the first input signal if the first and second input signals are determined to be similar to one another and to select the second input signal if the first and second input signals are determined to be dissimilar to one another,
wherein the first input signal corresponds to a higher quality signal for audio content of both of the input signals than the second input signal, and
wherein the controller is configured to identify one of two received input signals as the first input signal and the other as the second input signal based on at least one of sample rate and digital resolution.

* * * * *